United States Patent
Mendoza et al.

(10) Patent No.: US 6,175,214 B1
(45) Date of Patent: Jan. 16, 2001

(54) HIGH VOLTAGE POWER SUPPLY USING THIN METAL FILM BATTERIES

(75) Inventors: Raul Mendoza, Upland; Keith G. Kato, Alta Loma, both of CA (US)

(73) Assignee: Raytheon Company, Lexington, MA (US)

( * ) Notice: Under 35 U.S.C. 154(b), the term of this patent shall be extended for 0 days.

(21) Appl. No.: 09/172,566

(22) Filed: Oct. 14, 1998

(51) Int. Cl.$^7$ .......................... H01M 10/46; H01M 10/44
(52) U.S. Cl. ................................. 320/116; 320/118
(58) Field of Search .................... 320/116, 118, 320/179, 120, 122, 134, 136; 429/149, 150, 152, 156, 157

(56) References Cited

U.S. PATENT DOCUMENTS

| | | | |
|---|---|---|---|
| 2,632,784 | * 3/1953 | Marsal et al. | 429/157 |
| 3,625,767 | 12/1971 | Clark et al. | |
| 3,784,411 | * 1/1974 | Ciliberti, Jr. | |
| 4,091,184 | 5/1978 | Erisman et al. | |
| 4,176,295 | 11/1979 | Davis et al. | |
| 4,287,267 | 9/1981 | Whittlesey | |
| 4,879,188 | * 11/1989 | Meinhold et al. | 429/7 |
| 4,935,315 | * 6/1990 | Herrin | 429/50 |
| 5,192,827 | 3/1993 | Jasper, Jr. | |
| 5,364,710 | 11/1994 | Hikita | |
| 5,369,351 | * 11/1994 | Adams | 320/121 |
| 5,393,619 | * 2/1995 | Mayer et al. | 429/152 |
| 5,498,490 | * 3/1996 | Brodd | 429/149 |
| 5,503,948 | * 4/1996 | Mackay et al. | 429/152 |
| 5,512,387 | * 4/1996 | Ovshinsky | 429/152 |
| 5,552,242 | * 9/1996 | Ovshinsky et al. | 429/152 |
| 5,552,243 | * 9/1996 | Klein | 429/157 |
| 5,565,711 | * 10/1996 | Hagiwara | 429/150 X |
| 5,569,520 | * 10/1996 | Bates | 429/162 |
| 5,612,152 | * 3/1997 | Bates | 429/157 X |
| 5,958,618 | * 9/1999 | Sullivan | |

FOREIGN PATENT DOCUMENTS

| | | |
|---|---|---|
| 28 38 996 | 3/1980 | (DE) |
| 197 08 405 | 10/1997 | (DE) |
| 0 013 005 | 7/1980 | (EP) |
| 0 347 910 | 12/1989 | (EP) |
| 0 523 840 | 1/1993 | (EP) |
| 0 609 101 | 8/1994 | (EP) |
| WO 92 02963 | 2/1992 | (WO) |
| WO 94 29909 | 12/1994 | (WO) |

OTHER PUBLICATIONS

La Follette, R.M. "Design Fundamentals of High Power Density" Journal of the Electrochemical society (12/90).*

* cited by examiner

*Primary Examiner*—Edward H. Tso
(74) *Attorney, Agent, or Firm*—Harness, Dickey & Pierce, P.L.C.

(57) ABSTRACT

A plurality of thin metal film battery cells (12) are stacked together to form a stick (14). An array of the sticks (14) are carried in a case (16) and are connected in series to provide a high voltage output at the case terminals (20, 22). A switching arrangement managed by a control unit (52) is used to test and recharge the battery cells. If one of the sticks (14) is defective, it is bypassed and replaced with a replacement stick in order to maintain the desired output voltage.

22 Claims, 7 Drawing Sheets ium of the Air Force. The Government has certain rights in
HIGH VOLTAGE POWER SUPPLY USING THIN METAL FILM BATTERIES The invention was made with Government support under Contract No. F29601-92-C-0124 awarded by the Department of the Air Force. The Government has certain rights in this invention.

BACKGROUND OF THE INVENTION

1. Technical Field

The present invention relates generally to high voltage power supplies, and more particularly to a high voltage power supply comprised of a plurality of thin metal film batteries.

2. Discussion

Limited burst directed energy military systems are well known and have a high target kill success rate. The systems require a high voltage electrical source that drives the system in either a pulsed or continuous operation for short engagement times at high average powers, typically on the order of hundreds of kilowatts. Conventional energy storage and high voltage power supplies are of the type disclosed in research papers published and proceedings such as the IEEE Pulsed Power Conference or the IEEE Modulator Conference.

One disadvantage of the prior energy storage and high voltage power supply art is the size of the power supplies, especially when utilized with mobile systems of limited available platform energy. In such cases, energy must be stored in a multi-component medium, such as a homopolar generator, compulsator, flywheel, or capacitor, at comparatively low voltages, then converted to high voltage of appropriate volt-ampere-pulse duration characteristics. The separate components typically require ferrite materials for transformer cores, thick conductors to handle high input currents, and substantive separations to handle high output voltages.

A second disadvantage of the prior energy storage art is that for systems of reasonable size and weight, available energy storage density means engagement times are typically only 5–10 seconds.

Another disadvantage of the prior energy storage and high voltage power supply art is that to obtain compact high voltage power supplies, a series resonant inverter ("SRI") approach is used. However, high average power throughput using the SRI approach presents a design limitation on the switching frequency. Lower switching frequencies must be used for high average power throughput, meaning regulation of the volt-ampere values at the load is not sufficiently fast.

A further disadvantage of the prior energy storage and high voltage power supply art is that the SRI approach creates low frequency noise from the switches which propagates ubiquitously throughout the rest of the system, with attendant contamination and control problems.

Still another disadvantage of the prior energy storage and high voltage power supply art is the inherent control complexity of using several separate subsystem components which must be simultaneously monitored, regulated, timed, and controlled for both normal operation and fault response.

The prior art energy storage and high voltage power supplies also suffer from their comparative lower overall system energy efficiency. Each subsystem component has its own input-to-output conversion efficiency. These efficiencies are never 100%. Hence, each additional subsystem component removes usable energy, with attendant problems of heat production and thermal management.

SUMMARY OF THE INVENTION

Accordingly, the present invention provides a high voltage battery power supply that uses thin metal film batteries in a large series assembly. This supply can be used to replace the high voltage power supply and pulse shaping components in limited burst energy military systems. In the high voltage battery power supply system of the present invention, an extremely large number of electrical cells are placed in series, with the voltages from each of the cells being summed, while the total output from the cells is voltage regulated, and the performance of the assembly is safeguarded against both short circuit and open circuit faults of any individual cell.

Further, the high voltage battery power supply of the present invention produces a high voltage, of up to 100 kilovolts, moderate current, in the order of 25 amperes, electrical source, which can drive a high power microwave source in either pulsed or continuous operation for short engagement times, typically around ten seconds, and at high average power of a hundred kilowatts and beyond.

The high power battery voltage supply system of the present invention has inherently only the intrinsic efficiency of "one" component (the constituent thin metal film battery) and that efficiency is determined principally by the load impedance (on the order of 2,000 to 8,000 ohms) divided by the sum of the high power battery voltage supply system of the present invention total internal resistance (on the order of 100 ohms) and load impedance. The high power battery voltage supply system of the present invention thus has an inherent efficiency in the upper range, compared to efficiencies of less than 90%, end-to-end, for prior art.

BRIEF DESCRIPTION OF THE DRAWINGS

Further advantages of the present invention will become apparent to those skilled in the art after having the benefit of reading the foregoing specification and by reference to the drawings in which.

DETAILED DESCRIPTION OF THE PREFERRED EMBODIMENT

Figure 1:
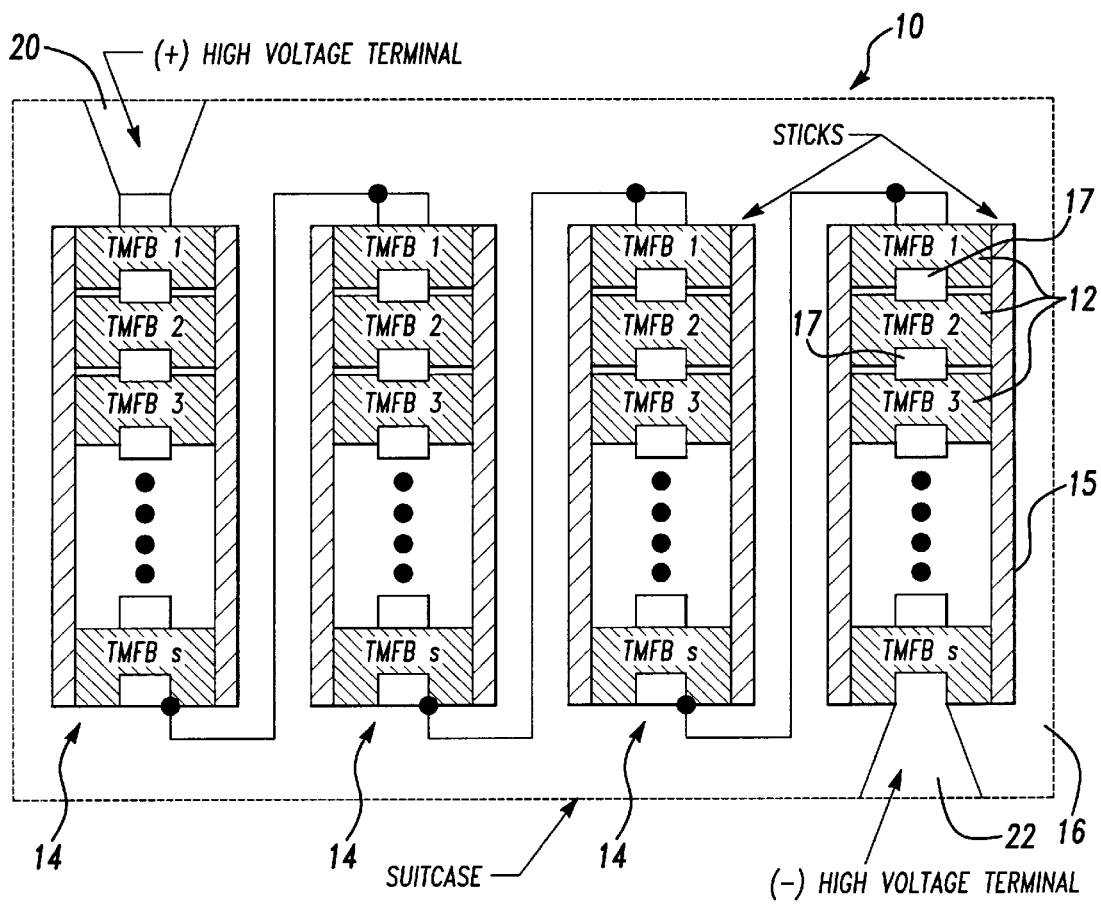
FIG. 1 is a side elevational view of a high voltage battery power supply of the present invention.

Referring to FIG. 1, a high voltage battery power supply according to the present invention is shown at 10. The high voltage power supply of the present invention produces a high voltage (of at least 10 kilovolts and up to 100 kilovolts), moderate current (on the order of 25 amperes) electrical operation for short engagement times (on the order of 10 seconds continuously, and proportionally longer by the duty factor for pulses) at high average powers (on the order of hundreds of kilowatts). The power supply is of the type known as a "Marx generator" that uses electrochemical cells 12 instead of capacitors. It eliminates energy storage, high voltage power supply, and pulse-forming components in favor of basically a rechargeable high voltage battery. Hence, apart from some switching, there is no fundamental need for other components such as pulse forming networks, high voltage transformers, or rectifiers. To produce pulsing, the switches within the power supply could be closed and opened controllably and quickly enough by available switching schemes such as optically-activated solid-state electrical switches.

It is also possible that the power supply itself need not be turned on and off to create the pulsing. Instead, the power supply would maintain the required voltage and be capable of delivering current on demand, but for some classes of RF sources a quickly-implemented external control mechanism would be used to interrupt the conducting currents within the RF source.

Preferably, the battery power supply utilizes thin metal film batteries, such as those produced for commercial use by Bolder Technologies Corporation of Wheat Ridge, Colorado. Bolder uses well-established lead-acid battery electrochemistry, but manufactures C-sized cells (0.9 inches diameter×2.76 inches long, 90 grams=3.17 ounces) in a fashion similar to energy density capacitors, using thin (0.002 inch thick) lead foil coated on both sides with a thin (0.003 inch thick) layer of active paste. The paste is not applied to a thin strip of foil along one edge; this strip allows the electrical attachment to each cell terminal. To create the C-sized cells, electrodes of opposite polarity are interleaved and rolled like a jellyroll into a cylinder, with a thin (0.008 inch) glass fiber separator maintaining the spacing between electrodes of opposite polarity.

The cell is then back-filled with sulfuric acid and sealed. The uncoated strips of foil of like polarity emerge from opposite ends of the cylinder, where they attach to the external terminals. This manufacturing method can produce a 16–19 fold increase in the ratio of plate surface to active material, and a 20–80 fold decrease in conduction path length within the cell. From the size of a standard C-cell, up to 1.2 ampere-hours (2.00 volts×1.2 amperes×3,600 seconds=8,640 joules) per cell at modest extracted currents may be achieved. With extracted currents as high as 250 amperes, 5 seconds of electrical power (1.32 volts×250 amperes×5 seconds=1,650 joules) can be delivered before the cell is exhausted. As is expected, the voltage delivered per cell sags with both increasing extracted current and deeper depth of discharge. The stated internal resistance of each cell is nominally 1.5 milliohms, and Bolder data of a fresh cell connected to a 0.1 milliohm load indicates a discharge level of 1,000 amperes is achieved in 200 nanoseconds, with a maximum discharge of 1,800 amperes achieved at 15 microseconds momentarily. The voltage sags from 2.1 volts to 1 volt at the 1,200 ampere point (approximately 500 nanoseconds), but this test indicates the quick response times of the cell from open to dead-short loads. Because of the low internal resistance per cell, even battery assemblies on the order of 50,000 series cells would present a total internal resistance of less than 100 ohms, as compared with typical RF source impedances in the thousands of ohms. Thus, comparatively little heat would be produced inside the cells.

Battery Sticks

Figure 2:
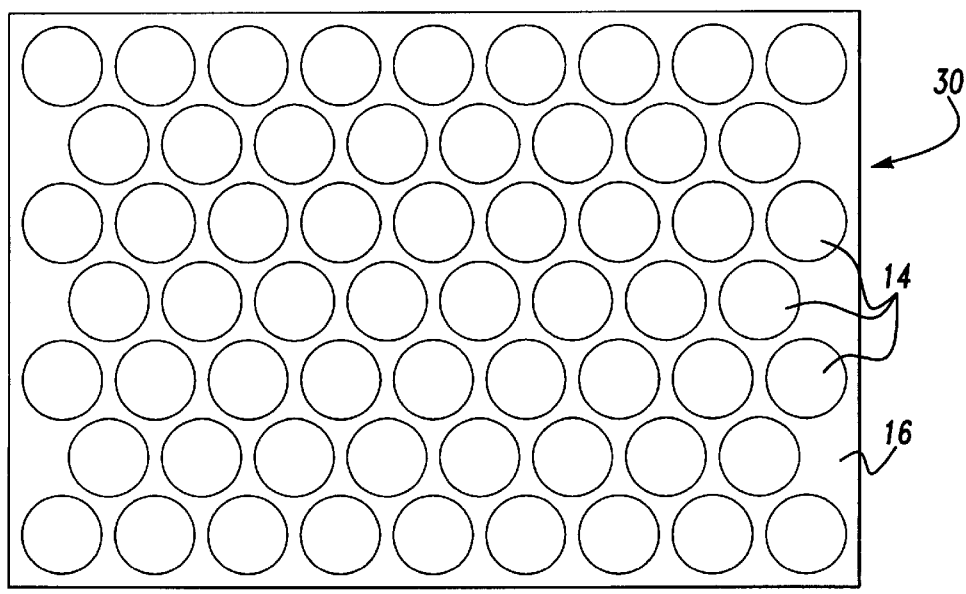
FIG. 2 is a top plan view of the packing layout for the plurality of cells shown in FIG. 1.

The high power voltage supply system design uses modular sub-assemblies of cells that are hard-mounted into "sticks" of safely-handled total voltage (about 100 volts). Each stick 14 can be thought of as an arrangement of adjacent cells 12 within a long flashlight-type housing 15. Electrical contacts 17 on opposite faces of each cell 12 serve to connect the cells in series. As shown in FIG. 1, sticks 14 can be further placed into a larger suitcase structure 16 for mechanical integrity, cooling, high voltage insulation, and ease of handling. Each suitcase includes demountable positive and negative high voltage connectors 20, 22 to make the series electrical connection to adjacent suitcases (not shown) in the circuit. The suitcases can be of any convenient shape for placement available into spaces. For example, as shown at 30 in FIG. 2, for a nominal 1 inch diameter for each stick 14, an area of less than 7 inches×11 inches can hold 60 sticks in a planar arrangement, with 0.25 inch surrounding each stick for cooling.

The high power voltage supply system of the present invention uses on the order of 50,000 cells in series to produce 100 kilovolts at low (1 ampere) current draw, and a greater number if higher currents are drawn, due to both voltage sag at higher currents and rundown of the cells at greater depths of discharge. Because the cells are in series in the high power voltage supply system, an open-circuit failure of a single cell would cause the high power voltage supply system to fail. The present invention solves this problem by providing extra sticks 14 in case 16 which can be used to replace failed sticks. As will appear, the system includes testing circuit in control 52 for testing the sticks and a switching network for bypassing failed sticks and inserting one of the extra sticks into the series arrangement of sticks in order to maintain or regulate the desired output voltage supplied between case terminals 20 and 22.

If a single cell has a reliability of r, the probability that N such cells will simultaneously operate is $r^N$, and the probability that one or more cells will fail is $1-r^N$. For N=50,000, Table 1 shows the calculated probability of one or more cells failing in a 50,000 cell series assembly for various values of r. The probability of the high power voltage supply system's failure is unacceptably high unless less than one cell in 10,000,000 is expected to fail. Even so, this failure is not recoverable.

TABLE 1

| r | $1-r^{50,000}$ |
| --- | --- |
| 0.9 | 1.000 000 |
| 0.99 | 1.000 000 |
| 0.999 | 1.000 000 |
| 0.999 9 | 0.993 264 |
| 0.999 99 | 0.393 471 |
| 0.999 999 | 0.048 771 |
| 0.999 999 9 | 0.004 988 |
| 0.999 999 99 | 0.000 500 |
| 0.999 999 999 | 0.000 050 |

A similar calculation for N=50 is shown in Table 2 for various values of r.

TABLE 2

| r | $1-r^{50}$ |
|---|---|
| 0.9 | 0.994 846 |
| 0.99 | 0.394 994 |
| 0.999 | 0.048 794 |
| 0.999 9 | 0.004 988 |
| 0.999 99 | 0.000 500 |
| 0.999 999 | 0.000 050 |

This calculation represents a stick of 50 cells (100 volt denomination for each stick). It can be seen that for the same probability level of failure of one or more cells (e.g., last row of Table 1) versus one or more sticks (e.g., last row of Table 2), the former can be achieved using cells of lower (by a factor of 1,000) intrinsic reliability. This justifies that the sticks can be the high power voltage supply system building unit, and some means to accommodate stick failures be part of the high power voltage supply system design.

For N=1,000 sticks in series, with a probability of stick failure of 1−0.9995=0.0005 (based on stick reliability for cell r=0.99999), a Poisson probability distribution shown in Table 3 indicates the probability of failure of m sticks out of 1,000 is $[(Np)^m e^{-Np}/m!]$.

TABLE 3

| m | P(m\|N) |
|---|---|
| 0 | 0.606 531 |
| 1 | 0.303 265 |
| 2 | 0.075 816 |
| 3 | 0.012 636 |
| 4 | 0.001 580 |
| 5 | 0.000 158 |
| >5 | 0.000 014 |

Thus, a system design capable of replacing at least five failed sticks is sufficient to obtain a system reliability of 0.99999. Additional sticks may be necessary to accommodate the voltage sag per cell for deeper depths of discharge.

The use of the extra or additional sticks not only permits a high power voltage supply system design which is forgiving of individual cell failures, but voltage regulation can also be accomplished by the additional sticks. The output voltage per cell will sag as higher current levels are drawn from the cells, and will also sag as the cells are used deeper into their depth of discharge. The high power voltage supply system will have additional sticks, not only for system recovery against failed single cells, but also to be added as needed in the stick voltage denominations (on the order of 100 volts) to maintain the desired the final voltage sum. For stick denominations of 100 volts, the load voltage can be regulated in quantized voltage steps representing on the order of 0.1% of the total. To do so requires that the controlling logic of control 52 which assigns and coordinates the switch configurations of each stick, also monitor and react to the load voltage.

System Architecture and Switching Scheme

Figure 3:
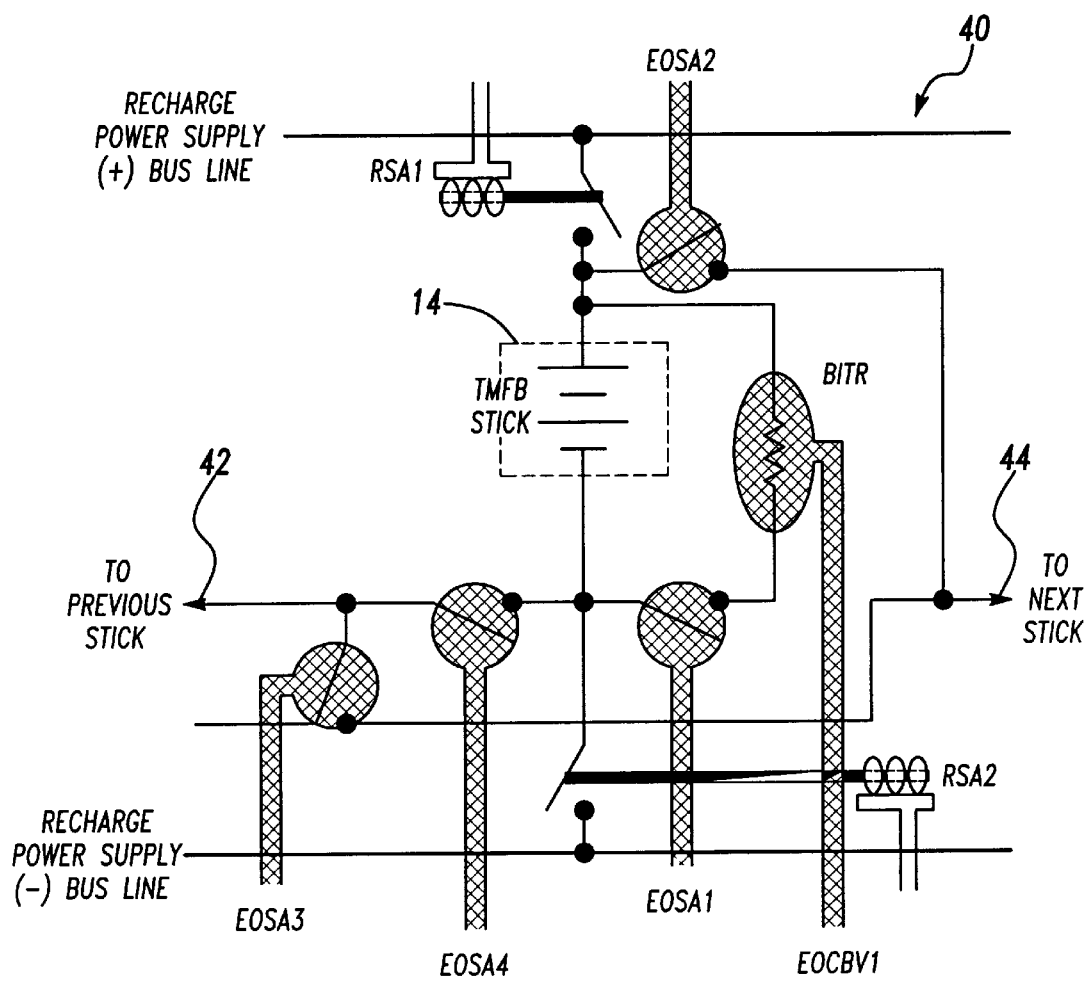
FIG. 3 is a schematic illustration of a switching scheme utilized for each stick of the high voltage battery supply of the present invention.

The internal switching arrangement for each stick 14 is shown at 40 in FIG. 3. Each stick requires six separately commanded "CLOSE-OPEN" switches. The explicit functions for the six switches is given in Table 4.

TABLE 4

| SWITCH: | OPEN STATE: | CLOSED STATE: |
|---|---|---|
| RSA1 | High voltage isolation of floating (+) terminal of stick n with respect to (+) bus line | Connects (+) terminal of stick n to recharge power supply |
| RSA2 | High voltage isolation of floating (−) terminal of stick n with respect to (−) bus line | Connects (−) terminal of stick n to recharge power supply |
| EOSA1 | Discharges BIT current flow through stick n test resistor BITR | Engages BIT current flow through stick n test resistor BITR |
| EOSA2 | Isolates (+) terminal stick n from (−) terminal of stick n + 1 during bypass | Connects terminal (+) of stick n to (−) terminal of stick n + 1 |
| EOSA3 | Isolates (+) terminal stick n − 1 from (−) terminal of stick n + 1 | Connects (+) terminal of stick n − 1 to (−) terminal of stick n + 1 during bypass |
| EOSA4 | Isolates (−) terminal stick n from (+) terminal of stick n − 1 during bypass | Connects (+) terminal of stick n − 1 to (−) terminal of stick n |

Two switches, RSA1 and RSA2 ("relay switch assembly") are normally open relays or contactors which engage all sticks in parallel to a recharge power supply at the nominal stick voltage, as represented by the positive and negative bus lines. When open, RSA1 and RSA2 must stand off the floating high voltage that the ends of each stick will assume with respect to ground, up to the maximum series voltage of the high power voltage supply system; RSA1 and RSA2 must also maintain high voltage isolation with respect to their command signal lines. However, because RSA1 and RSA2 need not close or open quickly, they can be mechanical switches. The high voltage standoff can then be accomplished by the use of liquid transformer oil or high-pressure sulfur hexafluoride gas, and the high voltage isolation of the command signal lines can be accomplished by proper placement of insulation in the mechanical switch armature.

Four additional switches, EOSA1–EOSA4 ("electro-optical switch assembly") are used to isolate, test, connect, or bypass sticks in the high power voltage supply system circuit. EOSA1–EOSA4 will also float, and must engage quickly, but inherently need to handle only the 100 volts potential voltage of each stick and the maximum current (on the order of 25 amperes) required of the high power voltage supply system . Because EOSA1–EOSA4 are floating, their command signal lines must be isolated from high voltage. To do so, EOSA1–EOSA4 can be based on the optically-controlled integrated gated bi-power transistor ("IGBT") switches presently used in floating high voltage power supplies (up to 100 kilovolts) built by the Hughes Research Laboratory in Malibu, Calif. Each EOSA requires a fiberoptic cable for high voltage isolation, a dedicated (and floating, but small) power supply of about 15 volts DC and 5–10 milliamperes, and a small electronics card holding the IGBT switches and other control circuit components.

Still referring to FIG. 3, switch EOSA1 is used to engage a built-in test ("BIT") resistor BITR across each TMFB stick to determine the operational readiness of that stick. A small voltage-to-frequency electronics package (EOCBV1, for "electro-optical converter, BIT voltage") similar to that for the EOSAs is used to send, via fiberoptic cable, the status of the BIT back to a central logic and controller which determines whether to engage or bypass that particular stick. It is presumed that the fiberoptic cables, wires for RSA1 and RSA2, and wires for the recharge power supply buses will emerge as a single bundle back to the controller. Also indicated in FIG. 3 are the connecting wires 42, 44 to the previous and next sticks, respectively, in the chain.

It should be noted that the high power battery voltage supply system of the present invention can use comparatively slow mechanical contactor switches if the current flow in the RF tubes can be interrupted. For magnetrons, this can be accomplished by using an exterior, low-inductance (hence fast) supplemental electromagnet field to drive a magnetron into an insulating condition. For linear RF tubes, a controlling modulating-anode can be used to interrupt electron beam flow quickly. The high power battery voltage supply system of the present invention would then provide high voltage between two tube nodes, which could rapidly provide the necessary current on demand.

Table 5 shows, for each stick, the individual switch states corresponding to five envisioned system states: Shutdown, Recharge, BIT, Engage, and Bypass.

Figure 8:
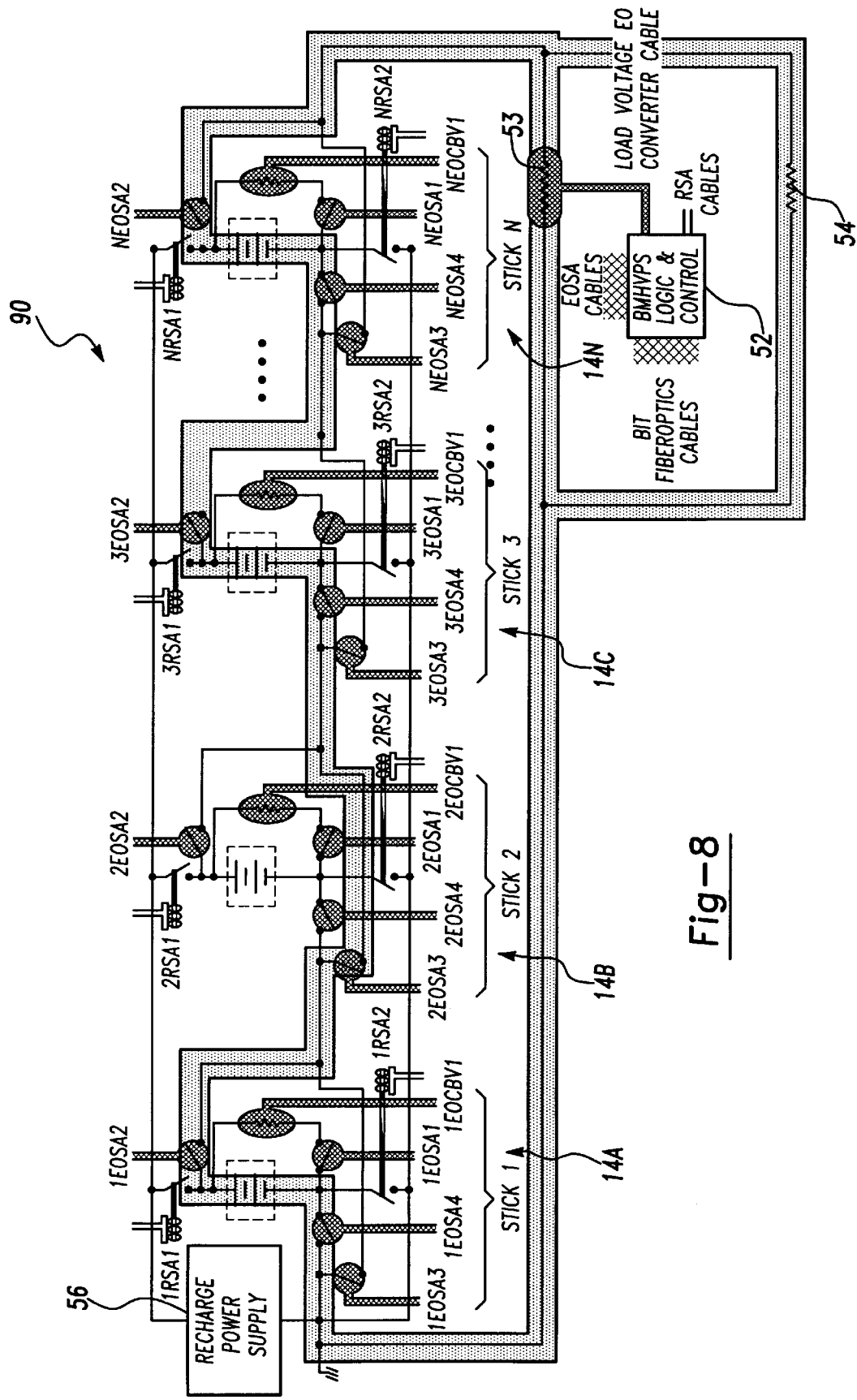
FIG. 8 is a schematic illustration of the high voltage battery supply of the present invention when the supply is in Engage mode, with stick two being in Bypass mode.

FIG. 8 shows at 90 the switch arrangements for each stick when the high power battery voltage supply system of the present invention is in the Engage state, but stick 2 is in Bypass as a result of a detected failure. The wide stippled line in the background shows the current path when stick 2 has been bypassed from the series, due to a BIT communication that stick 2 has failed. One or more of the sticks (not shown) which were not previously used can be coupled into the series arrangement of sticks to replace stick 2 to maintain or regulate the system output voltage to the desired level.

Estimates of Volume and Weight

To estimate volumes and weights for the high power battery voltage supply system approach, assumptions must be made for current drawn versus magazine capacity versus depth of discharge versus cell size. To illustrate the estimat-

TABLE 5

| Switch | RSA1 | | RSA2 | | EOSA1 | | EOSA2 | | EOSA3 | | EOSA4 | |
|---|---|---|---|---|---|---|---|---|---|---|---|---|
| State | Open | Close | Open | Close | Open | Close | Open | Close | Open | Close | Open | Close |
| SHUTDOWN | X | | X | | X | | X | | X | | X | |
| RECHARGE | | X | | X | X | | X | | X | | X | |
| BIT | X | | X | | | X | X | | X | | X | |
| ENGAGE | X | | X | | X | | | X | X | | | X |
| BYPASS | X | | X | | X | | X | | | X | X | |

The wide stippled line in the figures to be discussed shows the current path provided by the switch connections in each state.

Figure 4:
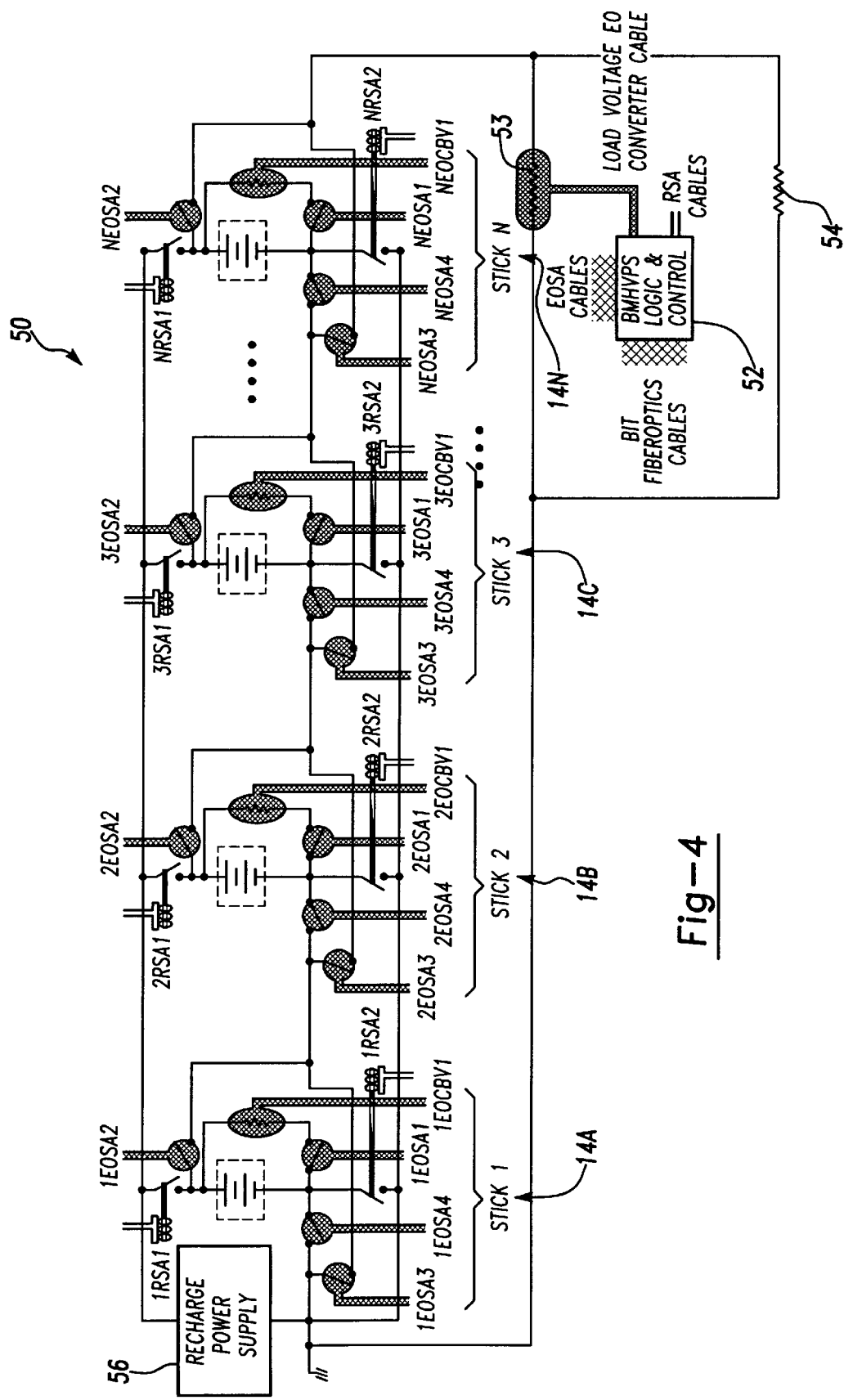
FIG. 4 is a schematic diagram of the high voltage battery supply of the present invention with switching arrangements for each stick during shut down of the high voltage battery supply.

FIG. 4 shows the complete conceptual high power battery voltage supply system of the present invention at 50, with switching arrangements for each stick when the high power battery voltage supply system of the present invention is in Shutdown. Sticks 14a, 14b, 14c, 14n are shown, with a high power battery voltage supply system control 52, which accepts all fiberoptic and electrical cables and controls all switches, a large-value resistor 53 in parallel with the real microwave load 54 to monitor the load voltage and send that information optically to the Control to assist in voltage regulation, and a Recharge power supply 56 which recharges the sticks. In Shutdown, all switches are open and all exterior electrical power is off.

Figure 5:
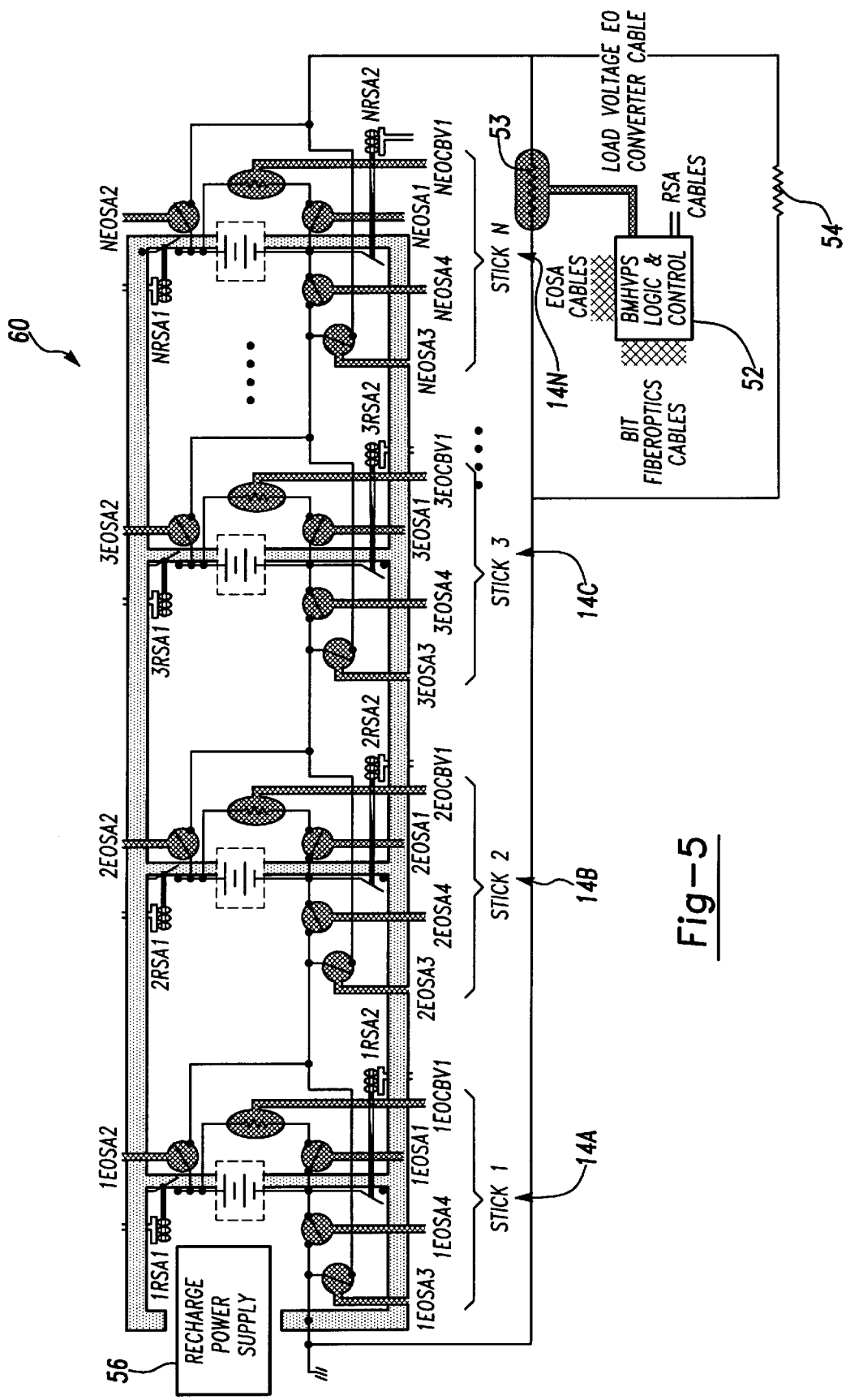
FIG. 5 is a schematic illustration of switch arrangements for each stick when the high voltage battery supply is in a recharge mode.

FIG. 5 shows at 60 the switching arrangements for each stick when the high power battery voltage supply system of the present invention is in Recharge. RSA1 and RSA2 for each stick is closed, with all other switches open. The electrical cables to all RSAs can either be paralleled to close and open all RSAs at once, or individually wired to each stick to preclude faulty stick recharging if necessary.

Figure 6:
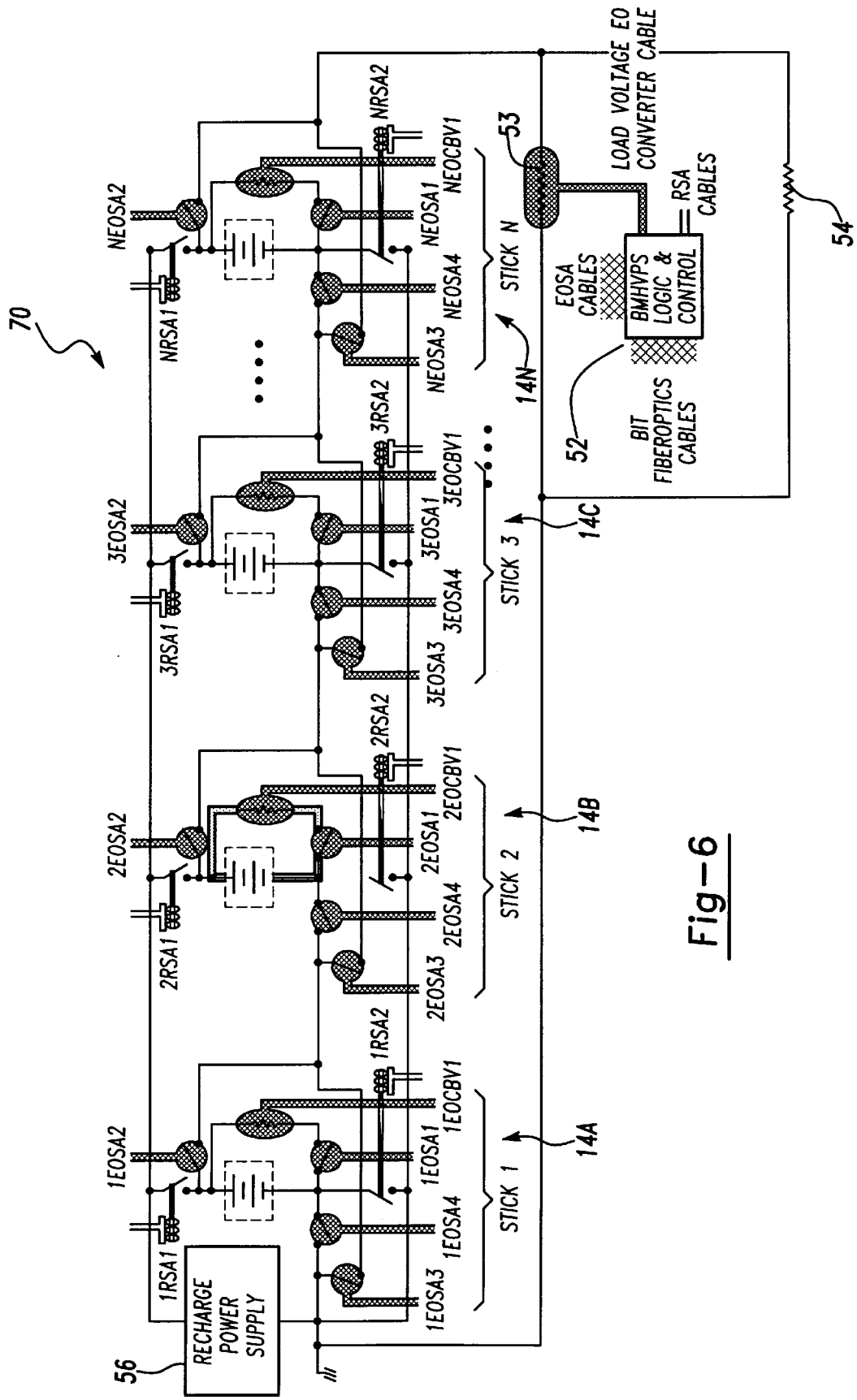
FIG. 6 is a schematic illustration of switch arrangements for each stick when only stick 2 is in BIT mode.

FIG. 6 shows at 70 the switch arrangements for each stick when stick 14b only of the high power battery voltage supply system of the present invention is in BIT, i.e. being tested. EOSA1 for stick 2 is closed, with all other switches open. The Control 52 can be designed to engage and examine each stick in a time sequence, rather than close all EOSA1s at once. If BIT signals are carried and electrically isolated by fiberoptic cables, and if the BIT test resistor is sufficiently large so that its current drain on the stick is negligible, BIT and fault response/voltage regulation can be a dynamic, real-time process while the high power battery voltage supply system is actively delivering energy to the load.

Figure 7:
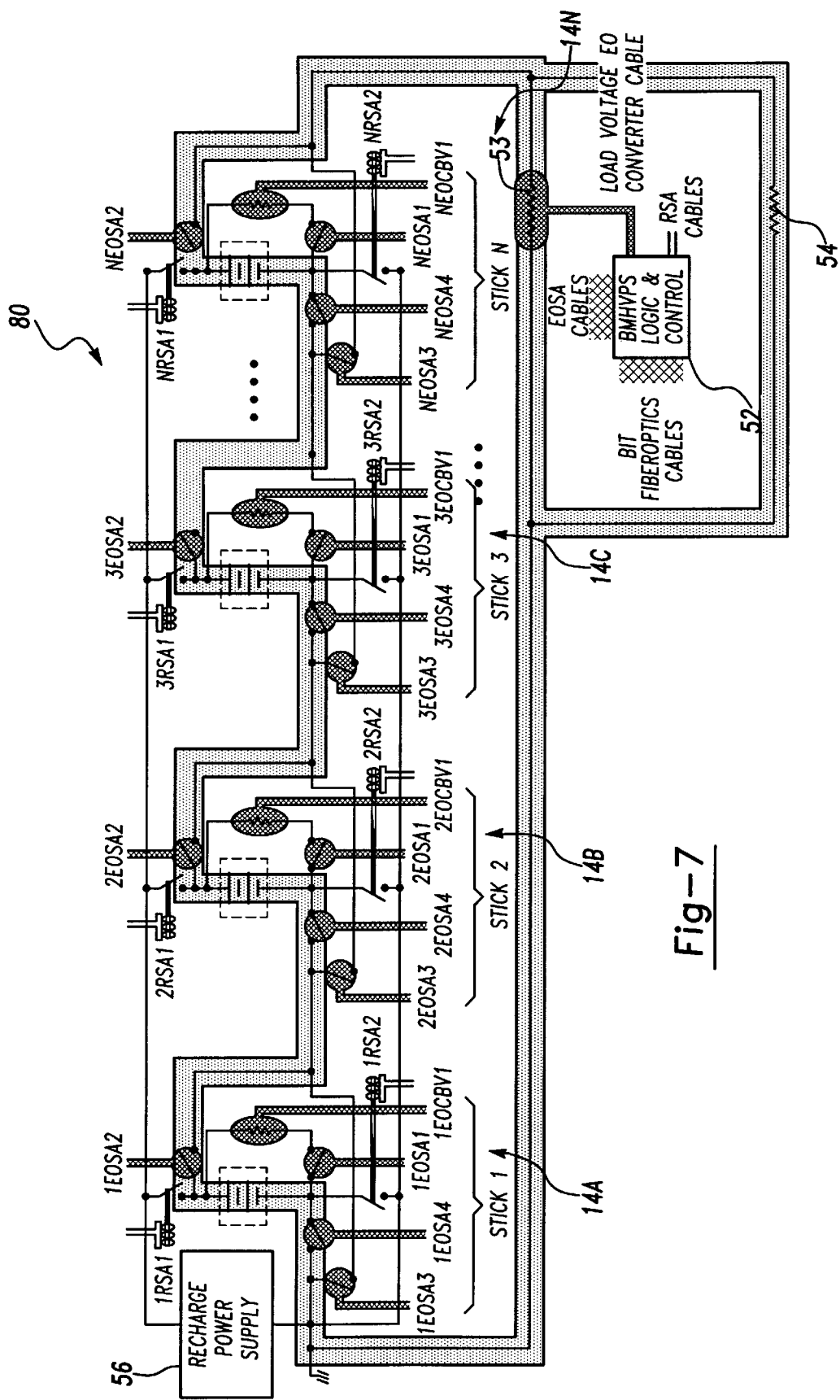
FIG. 7 is a schematic illustration of the high voltage battery supply showing the switch arrangements for each stick when the supply is in Engage mode.

FIG. 7 shows at 80 the switch arrangements for each stick when the high power battery voltage supply system of the present invention is in Engage mode with all of the sticks supplying power to the load 54.

ing process, consider a high power battery voltage supply system design suitable for a 70 kilovolt, 25 ampere microwave source. For example, for 25 amperes of drawn current, the average power delivered per cell is 50 watts (=50 watts/25 amperes=2.00 volts), which can be sustained until 5,100 joules have been delivered, or 102 seconds (=5,100 joules/50 watts). This translates into minimum design parameters of:

102 seconds of engagement time 70,000 volts/2.00 volts per cell=35,000 cells in series (=700 50-cell sticks)

35,000 cells×3 cubic inches per cell=105,000 cubic inches 35,000 cells×90 grams per cell/453.6 grams per pound=6,945 pounds 35,000 cells×1.5 milliohms per cell=53 ohms internal battery resistance where each cell is presumed to occupy a rectangular volume of 1 inch×1 inch×3 inches and weigh 90 grams. An arbitrary factor of volume (and hence weight) can be added to accommodate switches, electronics, cables, structure, and added sticks (to design against voltage drop during discharge, or for substitution during a stick fault), but these values represent a basic starting point.

Improvements in TMFB Form Factor

To reduce volume and weight, the high power battery voltage supply system approach can take advantage of smaller, custom-manufactured TMFBs from which lower engagement times can be tolerated. Estimating calculations can be redone for a high power battery voltage supply system made of ¼-height (0.75 inch long, still 1 inch in diameter) custom cells. A high power battery voltage supply system design suitable for a 70 kilovolt, 25 ampere microwave source will be used as an example. First, for a ¼ volume cell, the applicable Bolder data is for 25×4=100 amperes drawn current. This is because the internal cell surface area scales approximately as the cell volume, but the current density must increase inversely as the volume to obtain the same final current. Thus the Bolder data for 100 amperes of drawn current has average power delivered per cell at 169 watts (=169 watts/100 amperes=1.69 volts), which can be sustained until 3,042 joules have been delivered, or 18 seconds (=3,042 joules/169 watts). This translates into minimum design parameters of:
18 seconds of engagement time
70,000 volts/1.69 volts per cell=41,420 cells in series (=829 50-cell sticks)
41,420 cells×¾ cubic inches per cell=31,065 cubic inches
41,420 cells×90/4 grams per cell/453.6 grams per pound= 2,055 pounds
41,420 cells×1.5 milliohms per cell=62 ohms internal battery resistance
where volume reduction by 4 is apparent in the cell volume and weight. Thus, a reduction by a factor of about 3 is achieved in volume and weight, at the expense of reduction by a factor of about 5 in total engagement time, using this reduced-volume approach.

For the high power battery voltage supply system of the present invention, a custom militarized version of commercial Bolder C-cells may be a more desirable component. Such versions could be customized to:
1. take advantage of the aforementioned volume reduction;
2. take advantage of unused volume (there is no real need for the cells to be cylindrical; rectangular shapes, with flat interleaved metal electrode foils, may be preferable);
3. increase the reliability of cell-to-cell contact with overt connectors;
4. make the sticks rather than the cells as a fundamental unit.

As can be appreciated from the foregoing description, the high voltage battery supply of the present invention provides the following advantages over conventional systems: low cost; comfortable safety perceptions regarding lead-acid batteries; immediate (or continuous) refire capability; arbitrarily large magazine capacity at the expense of volume and weight, and no attendant electrical noise from high frequency switching (as occurs in switching high voltage power supplies) to produce self-EMI contamination.

It is contemplated that the high voltage battery power supply of the present invention will entirely replace components presently utilized to produce high voltage pulses into high power microwave sources. Currently, the components utilized include energy storage components such as homopolar generators, compulsators, flywheels and capacitors, power conditioning components such as inductors, capacitors and silicone controlled rectifier or integrated bipolar transistor switches, step-up transformers, rectifiers, filters, and pulse shaping components, such as inductors and capacitors in pulse forming networks. The high voltage power supply of the present invention is designed to be smaller and lighter than the above components that it replaces.

The high voltage battery power supply of the present invention also provides higher power and energy storage densities, resulting in longer weapon engagement times, when compared to conventional power supplies. The high voltage battery power supply of the present invention also is designed to handle parameters such as voltage regulation and voltage drop at the load, variable pulse durations and heat production in a more efficient manner than with conventional design approaches. The high voltage battery power supply of the present invention also produces comparatively little self generated electrical noise as compared to conventional approaches, thereby allowing the power supply to operate in a highly efficient manner in a tightly packed high power military system.

Other objects and advantages will become apparent to those skilled in the art after having the benefit of studying the foregoing text and drawings, taken in conjunction with the following claims.

What is claimed is:

1. A modular power supply, comprising:
   a plurality of thin metal film battery cells, each cell having generally parallel opposing major faces, one of the major faces having an electrically conductive portion of one polarity, the other major face having an electrically conductive portion of an opposite polarity;
   a housing for holding the cells in a stacked, series connected arrangement in the form of a stick, said stick having a terminal on each end thereof for delivering an output voltage for the stick which is the sum of the voltages provided by the series arrangement of thin metal film battery cells;
   a portable case;
   an array of sticks mounted in the case;
   circuitry for connecting the sticks in a series circuit; and
   a positive and negative output terminal located on the case for providing power from the series circuit of sticks to an external load;
   wherein the power supply is a Marx generator.

2. The power supply of claim 1, which further comprises:
   switching circuitry connected to the sticks for testing the sticks and bypassing defective sticks in the series circuit to maintain only operable sticks therein, the switching circuitry replacing a defective stick with another operable stick in the case in the series circuit in order to maintain a desired output voltage;
   said switching circuitry further operating to add an additional operable stick to the sticks of said series circuit when the desired output voltage drops below a given level.

3. The power supply of claim 2, wherein the switching circuitry comprises optically activated solid-state electronic switches.

4. The power supply of claim 3, which further comprises:
   a control unit for controlling the solid-state electronic switches to provide a multiplicity of different operating states.

5. The power supply of claim 4, wherein the battery cells are rechargeable, and wherein the power supply further comprises:
   a recharge power supply selectively coupled to the stick through the switching circuitry by said control unit to recharge said battery cells.

6. The power supply of claim 5, which further comprise:
   first and second relay switches connecting the sticks in parallel to said recharge power supply.

7. The power supply of claim 2, wherein said switching circuitry further includes a plurality of electro-optical switches connected to the sticks used to isolate, test, connect and bypass the sticks in the power supply in a selective manner.

8. The power supply of claim 7, wherein the electro-optical switches float with respect to the ground.

9. The power supply of claim 8, wherein the electro-optical switches comprise optically controlled integrated gated bipolar transistor switches.

10. The power supply of claim 1, wherein the series circuit of sticks produces a voltage on the order of 100 kilovolts and a current on the order of 25 amperes.

11. The power supply of claim 1, wherein the series circuit of sticks provides sufficient power to provide a burst of energy to drive a microwave source.

12. The power supply of claim 1 wherein the terminals are demountable to provide electrical connection to adjacent cases.

13. A portable power supply for providing power to a microwave source on the order of about 100 kilovolts and a current on the order of about 25 amperes, said power supply comprising:
- a plurality of sticks, each stick including a multiplicity of thin metal film battery cells stacked together in a series arrangement;
- a portable case;
- an array of sticks mounted in the case;
- circuitry for connecting the sticks in a series circuit;
- a positive output terminal on the case;
- a negative output terminal on the case;
- said series circuit of sticks being connected between the positive and negative output terminals for providing power at a desired power voltage output level;
- said case containing additional sticks which are not normally connected into said series circuit;
- a control unit;
- switching circuitry connected between the control unit and said sticks;
- wherein said control unit selectively places said switching circuitry in a test state for testing the sticks, with the control unit further operating to replace a defective stick with one of said additional sticks in order to maintain said desired output voltage level;
- wherein said control unit further operates to add additional operable sticks to the sticks of said series circuit when the desired output voltage drops below a given level; and
- wherein the power supply provides bursts of energy in a military environment.

14. The power supply of claim 13, wherein said sticks are rechargeable, and wherein said power supply further comprises a recharge power supply selectively coupled to the sticks through the switching circuitry by the control unit to recharge said sticks.

15. A method of generating power, said method comprising:
- connecting a plurality of thin metal film battery cells together in a series arrangement;
- stacking the cells together in an elongated housing to form a stick;
- mounting an array of sticks in a portable case;
- connecting the sticks together in a series circuit;
- providing output terminals on the case for delivering power provided by the series circuit of sticks to a load;
- connecting the sticks to switching circuitry;
- testing the sticks through the switching circuitry;
- using the switching circuitry to bypass a defective stick and replace the defective stick with an operable stick in order to maintain a desired output voltage level between the output terminals;
- controlling the switching circuitry to provide a multiplicity of independent operating states; and
- wherein the series circuit provides bursts of energy greater than available with an ordinary power supply.

16. The method of claim 15, wherein said series circuit of sticks provides a voltage on the order of 100 kilovolts and a current on the order of 25 amperes.

17. The method of claim 15, wherein the sticks are rechargeable, and wherein said method further comprises:
- using the switching circuitry to connect the sticks to a recharge power supply.

18. The method of claim 15 further including the step of controlling the switching circuitry to provide a shutdown switching state.

19. The method of claim 15 further including the step of controlling the switching circuitry to provide a recharge switching state.

20. The method of claim 15 further including the step of controlling the switching circuitry to provide a test switching state.

21. The method of claim 15 further including the step of controlling the switching circuitry to provide an engage switching state.

22. The method of claim 15 further including the step of controlling the switching circuitry to provide a bypass switching state.

* * * * *